(12) United States Patent
He et al.

(10) Patent No.: US 12,532,628 B2
(45) Date of Patent: Jan. 20, 2026

(54) DISPLAY PANEL AND PREPARATION METHOD THEREFOR

(71) Applicants: Huizhou China Star Optoelectronics Display Co., Ltd., Guangdong (CN); Shenzhen China Star Optoelectronics Semiconductor Display Technology Co., Ltd., Guangdong (CN)

(72) Inventors: Chao He, Guangdong (CN); Shijian Qin, Guangdong (CN)

(73) Assignees: Huizhou China Star Optoelectronics Display Co., Ltd., Huizhou (CN); Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 482 days.

(21) Appl. No.: 18/090,539

(22) Filed: Dec. 29, 2022

(65) Prior Publication Data

US 2024/0057425 A1 Feb. 15, 2024

(30) Foreign Application Priority Data

Aug. 12, 2022 (CN) .......................... 202210971713.7

(51) Int. Cl.
*H10K 59/35* (2023.01)
*H10K 59/122* (2023.01)
(Continued)

(52) U.S. Cl.
CPC ......... *H10K 59/353* (2023.02); *H10K 59/122* (2023.02); *H10K 71/00* (2023.02); *H10K 71/135* (2023.02); *H10K 59/1201* (2023.02)

(58) Field of Classification Search
CPC .. H10K 59/122; H10K 59/352; H10K 59/353; H10K 71/13; H10K 71/135
See application file for complete search history.

(56) References Cited

U.S. PATENT DOCUMENTS

| 8,183,768 B2 | 5/2012 | Ko |
| 11,158,681 B2 | 10/2021 | Matsueda |

(Continued)

FOREIGN PATENT DOCUMENTS

| CN | 101877357 | 11/2010 | |
| CN | 101877357 A | * 11/2010 | ....... H01L 21/02304 |

(Continued)

OTHER PUBLICATIONS

Machine translation, Joo, Korean Pat. Pub. No. KR20160067544A, translation date: May 28, 2025, Espacenet, all pages. (Year: 2025).*

(Continued)

*Primary Examiner* — Victoria K. Hall (57) ABSTRACT

The present invention provides a display panel and a preparation therefor. The display panel at least includes a plurality of pixel unit groups, each of the pixel unit groups includes a plurality of pixel units, each of the pixel units includes a plurality of sub-pixels, and each of the sub-pixels has a functional layer. For the display panel provided by the present invention, the functional layers of multiple sub-pixels with a same color of the plurality of sub-pixels in each of the pixel unit groups are arranged in a first direction and connected with each other, which reduces precision requirements for ink output of each nozzle during an ink jet printing process and reduces a thickness difference of the functional layers of each column of the sub-pixels arranged in a printing direction, thereby effectively preventing generation of lateral Suji Mura during display of the display panel.

12 Claims, 4 Drawing Sheets

(51) Int. Cl.
  *H10K 71/00*   (2023.01)
  *H10K 71/13*   (2023.01)
  *H10K 59/12*   (2023.01)

(56) References Cited

U.S. PATENT DOCUMENTS

2016/0042150 A1    2/2016  Moloughney
2020/0119106 A1*   4/2020  Kim ..................... H10K 59/122
2020/0212146 A1*   7/2020  Shin .................... H10K 59/131
2022/0278181 A1    9/2022  Cui

FOREIGN PATENT DOCUMENTS

CN      111863881       10/2020
KR    10-2016-0067544    *  6/2016   ............. H10K 59/00

OTHER PUBLICATIONS

Machine translation, Ko, Chinese Pat. Pub. No. CN101877357A, translation date: May 28, 2025, Espacnet, all pages. (Year: 2025).*
The State Intellectual Property Office of People's Republic of China, The Second Office Action, Chinese Application No. 202210971713.7, Jul. 4, 2025, all pages. (Year: 2025).*
Notification of Office Action and Search Report Dated Feb. 27, 2025 From The Intellectual Property Office of the People's Republic of China Re. Application No. 202210971713.7 and Its Translation Into English. (19 Pages).

* cited by examiner

Forming a patterned pixel definition layer on an anode metal layer, wherein the patterned pixel definition layer defines a plurality of pixel unit groups, each of the pixel unit groups includes a plurality of pixel units, each of the pixel units includes a plurality of sub-pixel openings, and multiple sub-pixel openings configured as a same color of the sub-pixel openings in each of the pixel unit groups are arranged in a first direction and connected with each other ⎯ S101

Injecting functional layer ink into one of the multiple connected sub-pixel openings in sequence along a second direction, so as to form functional layers of a plurality of sub-pixels in each of the pixel units, the first direction and the second direction having an included angle ⎯ S102

DISPLAY PANEL AND PREPARATION METHOD THEREFOR

CROSS-REFERENCE TO RELATED APPLICATIONS

This application claims the benefit of priority of Chinese Patent Application No. 202210971713.7 filed on Aug. 12, 2022, titled "DISPLAY PANEL AND PREPARATION METHOD THEREFOR", which is incorporated by reference in its entirety in the present application.

TECHNICAL FIELD

The present invention generally relates to a technical field of display panels, and in particular, to a display panel and a preparation method therefor.

BACKGROUND

Self-luminous devices such as organic light emitting diodes (OLEDs), due to having characteristics like a wide viewing angle, a long service life, energy saving, and environmental protection, have currently been applied to more and more display panels.

In a process of preparing a display panel with sub-pixels being organic light-emitting devices, a functional layer of each of the sub-pixels is usually formed by evaporation or ink jet printing. Since the ink jet printing has advantages of a high material utilization rate and low equipment investment cost, the ink jet printing has been widely applied to a preparation process of the display panel.

Based on this, how to ensure a display effect of the display panel prepared by an ink jet printing method is a problem that needs to be solved at present.

SUMMARY

In order to solve the above problems or other problems, the present invention provides following technical solutions.

In a first aspect, the present invention provides a display panel, and the display panel at least includes:
  a plurality of pixel unit groups, each of the pixel unit groups including a plurality of pixel units, each of the pixel units including a plurality of sub-pixels, and each of the sub-pixels having a functional layer;
  wherein the functional layers of multiple sub-pixels with a same color of the plurality of sub-pixels in each of the pixel unit groups are arranged in a first direction and connected with each other.

For the display panel according to an embodiment of the present invention, multiple pixel unit groups of the plurality of pixel unit groups are arranged in parallel in the first direction, and multiple pixel unit groups of the plurality of pixel unit groups are arranged in a staggered manner in a second direction, and an included angle is formed between the first direction and the second direction.

For the display panel according to an embodiment of the present invention, the plurality of pixel units arranged in the first direction in each of the pixel unit groups amounts to a first number, and adjacent two of the pixel unit groups in the second direction are staggered from each other by a second number of the pixel units, and the first number is greater than the second number.

For the display panel according to an embodiment of the present invention, the sub-pixels have a long axis and a short axis that are perpendicular to each other, the first direction is parallel to the long axis, and the second direction is parallel to the short axis.

For the display panel according to an embodiment of the present invention, the sub-pixels have a long axis and a short axis that are perpendicular to each other, the first direction is parallel to the short axis, and the second direction is parallel to the long axis.

For the display panel according to an embodiment of the present invention, the functional layers of the multiple sub-pixels with a same color of the plurality of sub-pixels in each of the pixel unit groups are connected to each other through a bridge structure; the sub-pixels have a first width in the second direction, the bridge structure has a second width in the second direction, and the first width is greater than the second width.

For the display panel according to an embodiment of the present invention, a number of the plurality of pixel units in each of the pixel unit groups is same.

For the display panel according to an embodiment of the present invention, the first number is any value between 3 and 5, and the second number is any value between 1 and 4.

In a second aspect, the present invention provides a preparation method for a display panel, the preparation method at least includes:
  forming a patterned pixel definition layer on an anode metal layer, wherein the patterned pixel definition layer defines a plurality of pixel unit groups, each of the pixel unit groups includes a plurality of pixel units, each of the pixel units includes a plurality of sub-pixel openings, and multiple sub-pixel openings configured as a same color of the sub-pixel openings in each of the pixel unit groups are arranged in a first direction and connected with each other; and
  injecting functional layer ink into one of the multiple connected sub-pixel openings in sequence along a second direction, so as to form functional layers of a plurality of sub-pixels in each of the pixel units; an included angle is formed between the first direction and the second direction.

For the preparation method for the display panel according to an embodiment of the present invention, the sub-pixels have a long axis and a short axis that are perpendicular to each other, the first direction is parallel to the long axis, and the second direction is parallel to the short axis.

Beneficial effects of the present invention are as follows. The present invention provides a display panel and a preparation therefor. The display panel at least includes a plurality of pixel unit groups, each of the pixel unit groups includes a plurality of pixel units; each of the pixel units includes a plurality of sub-pixels, and each of the sub-pixels has a functional layer. For the display panel provided by the present invention, the functional layers of multiple sub-pixels with a same color of the plurality of sub-pixels in each of the pixel unit groups are arranged in a first direction and connected with each other, which reduces precision requirements for ink output of each nozzle during an ink jet printing process and reduces a thickness difference of the functional layers of each column of the sub-pixels arranged along a printing direction, thereby effectively preventing generation of lateral Mura during display of the display panel.

DESCRIPTION OF DRAWINGS

In order to illustrate technical solutions of the present invention more clearly, the following briefly introduces accompanying drawings used in the description of the various embodiments of the present invention. Obviously, the accompanying drawings in the following description are only some embodiments of the present invention. For those skilled in the art, other drawings can also be obtained according to these accompanying drawings without any creative effort.

DETAILED DESCRIPTION OF PREFERRED EMBODIMENTS

Technical solutions in embodiments of the present invention will be clearly and completely described below with reference to the accompanying drawings in the embodiments of the present invention. Obviously, the described embodiments are only a part of embodiments not all embodiments of the present invention. Based on the embodiments in the present invention, all other embodiments obtained by those skilled in the art without creative efforts shall fall within the protection scope of the present invention.

Figure 1:
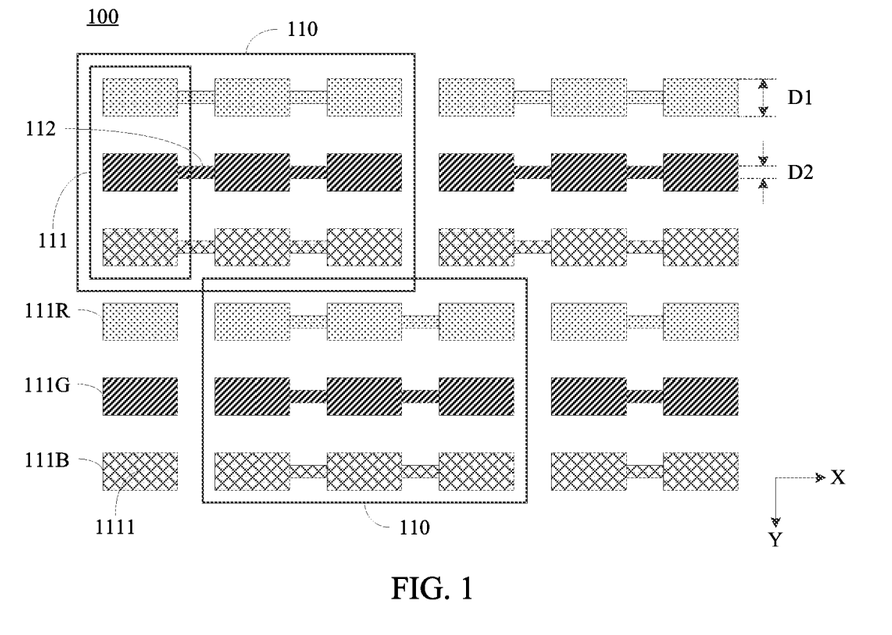
FIG. 1 is a top view schematic structural diagram of a display panel provided by an embodiment according to the present invention.

Please refer to FIG. 1. FIG. 1 shows a top view schematic structural diagram of a display panel 100 provided by an embodiment of the present invention. Various components of the embodiment according to the present invention and a relative positional relationship among the various components can be seen intuitively from the figure.

As shown in FIG. 1, the display panel 100 at least includes a plurality of pixel unit groups 110. Next, each component in the display panel 100 will be described in detail with reference to FIG. 1.

Each of the pixel unit groups 110 includes a plurality of pixel units 111. Each of the pixel units 111 includes a plurality of sub-pixels. The sub-pixels include a red sub-pixel 111R, a green sub-pixel 111G, and a blue sub-pixel 111B. Each of the sub-pixels has a functional layer 1111.

It should be noted that, in some embodiments, the plurality of sub-pixels in the display panel are arranged in a side by side (SBS) manner. Specifically, each of the sub-pixels does not touch each other and is arranged in an array. However, when the functional layer in each of the sub-pixels is prepared in an ink jet printing method, due to a difference in ink output of each of nozzles arranged perpendicular to a printing direction, there will be a thickness difference of the functional layers of each column of the sub-pixels arranged perpendicular to the printing direction, thereby generating lateral Mura extending along the printing direction.

Now refer back to FIG. 1, in the embodiment of the present invention, the inventor designs that the functional layers 1111 of multiple sub-pixels with a same color of the plurality of sub-pixels in each of the pixel unit groups 110 are arranged in a first direction X and connected with each other. Specifically, as shown in FIG. 1, the functional layers 1111 of a plurality of the red sub-pixels 111R that belong to different pixel units 111 in each of the pixel unit groups 110 are arranged in the first direction X and connected with each other, the functional layers 1111 of a plurality of the green sub-pixels 111G that belong to different pixel units 111 in each of the pixel unit groups 110 are arranged in the first direction X and connected with each other, and the functional layers 1111 of a plurality of the blue sub-pixels 111B that belong to different pixel units 111 in each of the pixel unit groups 110 are arranged in the first direction X and connected with each other.

It should be noted that, in such an arranging manner, when the functional layer 1111 of each of the sub-pixels is prepared through an ink jet printing process, since each of the nozzles arranged perpendicular to the printing direction needs to spray on multiple sub-pixels at a time, the ink output of each of the nozzles in each spraying increases (in this embodiment, the ink output of each of the nozzles becomes three times an original ink output), thereby reducing precision requirements for the ink output of each of the nozzles during the ink jet printing process and reducing the thickness difference of the functional layers 1111 of each column of the sub-pixels arranged in the printing direction. That is, generation of the above-mentioned lateral Mura is prevented effectively.

Further, please continue to refer to FIG. 1. In this embodiment, as shown in FIG. 1, multiple pixel unit groups of the plurality of pixel unit groups 110 are arranged in parallel in the first direction X, and multiple pixel unit groups of the plurality of pixel unit groups 110 are arranged in a staggered manner in a second direction Y. An included angle is formed between the first direction X and the second direction Y. Specifically, the first direction X is perpendicular to the second direction Y.

Specifically, please refer to FIG. 1, the above-mentioned arrangement in the staggered manner refers to that adjacent pixel unit groups 110 are not arranged in a straight line in the second direction Y, so that the plurality of pixel units 111 in one of the pixel unit groups 110 corresponds to parts of the pixel units 111 in other two of the pixel unit groups 110 in a one-to-one correspondence in the second direction Y.

It should be noted that, if such an arrangement is not adopted, multiple pairs of adjacent sub-pixels with the same thickness difference will be arranged along the printing direction (i.e., the second direction Y). That is, the above-mentioned thickness difference will extend along a straight line parallel to the second direction Y and will be observed by a user, and a visual effect is relatively obvious. However, if such an arrangement is adopted, the multiple pairs of adjacent sub-pixels with the same thickness difference can be arranged in a staggered manner in the printing direction (i.e., the second direction Y). Specifically, the above-mentioned multiple pairs of adjacent sub-pixels can be dispersedly arranged in the first direction X perpendicular to the second direction Y. That is, the above thickness difference will be dispersed in the first direction X, and the visual effect is less obvious, thus further reducing visual conspicuousness of the above-mentioned lateral Mura.

Further, in another modified embodiment according to the present invention, the above-mentioned arrangement in the staggered manner may also be set between the sub-pixels with different colors in one of the pixel unit groups 110. Taking FIG. 1 as an example, the multiple connected red sub-pixels 111R and the multiple connected green sub-pixels 111G in one of the pixel unit groups 110 are arranged in the staggered manner.

Further, in the embodiment of the present invention, the plurality of pixel units 111 arranged along the first direction X in each of the pixel unit groups 110 amounts to a first number, and adjacent two of the pixel unit groups 110 in the second direction Y are staggered from each other by a second number of the pixel units, and the first number is greater than the second number.

Specifically, please continue to refer to FIG. 1, in this embodiment, the above-mentioned first number is 3, and the above-mentioned second number is 1 or 2.

Figure 5:
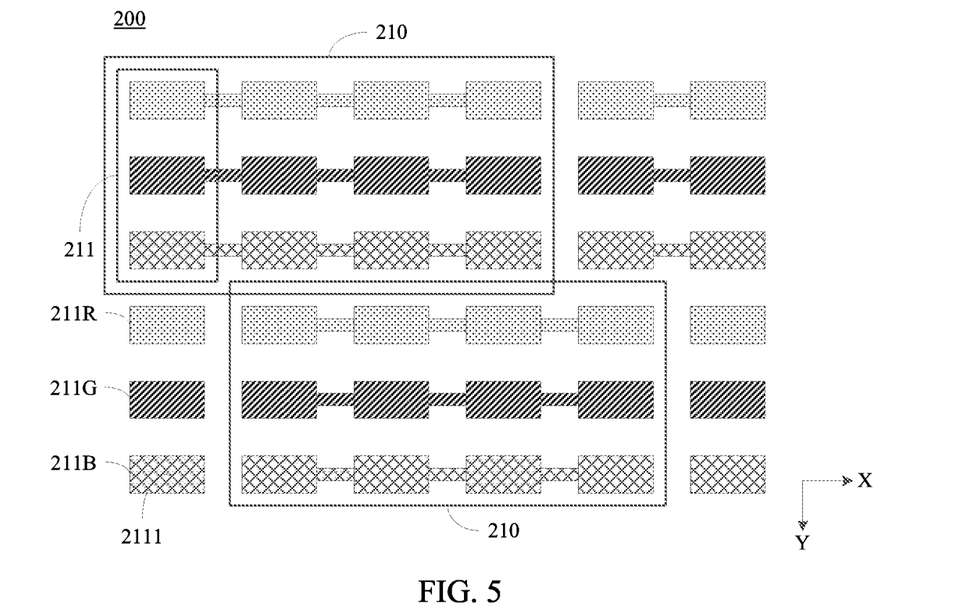
FIG. 5 is another top view schematic structural diagram of the display panel provided by an embodiment according to the present invention.
Figure 6:
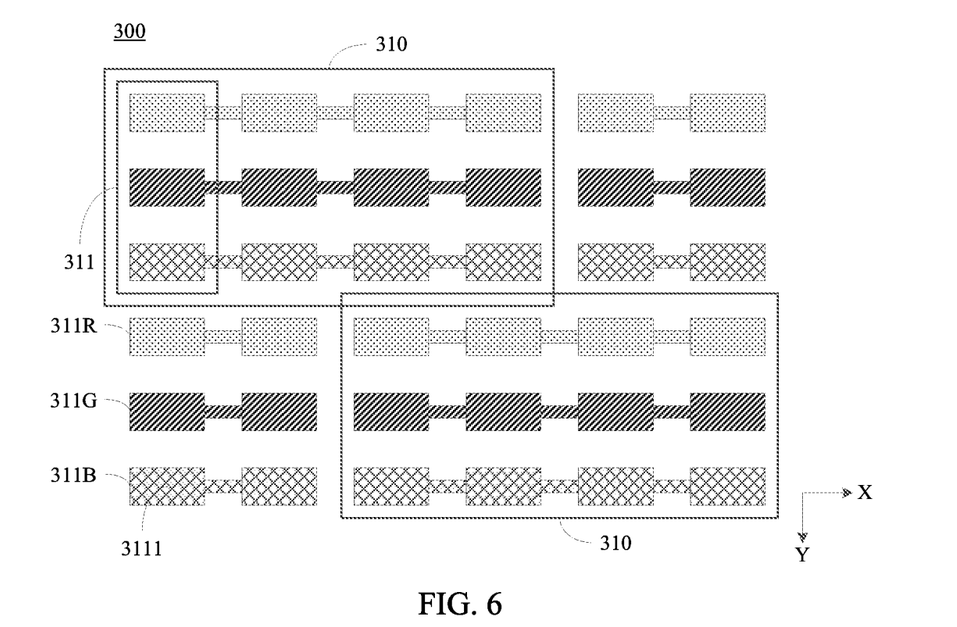
FIG. 6 is another top view schematic structural diagram of the display panel provided by an embodiment according to the present invention.

Next, please refer to FIG. 5 and FIG. 6. FIG. 5 shows another top view schematic structural diagram of a display panel 200 provided by an embodiment according to the present invention. FIG. 6 shows another top view schematic structural diagram of a display panel 300 provided by an embodiment according to the present invention.

It should be noted that, in some embodiments according to the present invention, the above-mentioned second number may be 1 to 3. Specifically, as shown in FIG. 5, the above-mentioned second number is 1 or 3, and the above-mentioned first number is 4. That is, in this embodiment, each pixel unit group 210 has 4 pixel units 211. Functional layers 2111 of 4 red sub-pixels 211R that belong to different pixel units 211 in each pixel unit group 210 are arranged in the first direction X and connected with each other, functional layers 2111 of 4 green sub-pixels 211G that belong to different pixel units 211 in each pixel unit group 210 are arranged in the first direction X and connected with each other, and functional layers 2111 of 4 blue sub-pixels 211B that belong to different pixel units 211 in each pixel unit group 210 are arranged in the first direction X and connected with each other. In addition, adjacent two of the pixel unit groups 210 in the second direction Y are staggered from each other by 1 to 3 pixel units 211. Specifically, as shown in FIG. 6, the above-mentioned second number is 2, and the above-mentioned first number is 4. That is, in this embodiment, each pixel unit group 310 has 4 pixel units 311. Functional layers 3111 of 4 red sub-pixels 311R that belong to different pixel units 311 in each pixel unit group 310 are arranged in the first direction X and connected with each other, functional layers 3111 of 4 green sub-pixels 311G that belong to different pixel units 311 in each pixel unit group 310 are arranged in the first direction X and connected with each other, and functional layers 3111 of 4 blue sub-pixels 311B that belong to different pixel units 311 in each pixel unit group 310 are arranged in the first direction X and connected with each other. In addition, adjacent two of the pixel unit groups 310 in the second direction Y are staggered from each other by 2 pixel units 311.

Further, in another modified embodiment according to the present invention, when the above-mentioned first number is 5, adjacent two of the pixel unit groups 210 in the second direction Y may be staggered from each other by 1 to 4 pixel units 211. When the above-mentioned first number is 3, adjacent two of the pixel unit groups 210 in the second direction Y may be staggered from each other by 1 to 2 pixel units 211.

Specifically, in the above-mentioned three embodiments shown in FIG. 1, FIG. 5, and FIG. 6, a number of the plurality of pixel units in each of the pixel unit groups is the same. It should be understood that in another modified embodiment according to the present invention, the number of the plurality of pixel units in each of the pixel unit groups may be different, which is not limited in the present invention. In addition, in these embodiments, a spraying time point of each of the nozzles in the ink jet printing process is set correspondingly.

Further, the sub-pixels have a long axis (not marked) and a short axis (not marked) that are perpendicular to each other. Please continue to refer to FIG. 1. In the embodiment of the present invention, the above-mentioned first direction X is parallel to the long axis, and the second direction Y is parallel to the short axis. That is, the functional layers 1111 of the multiple sub-pixels with the same color of the plurality of sub-pixels in each of the pixel unit groups 110 are arranged along a direction of the long axis of the sub-pixels and connected with each other, and the second direction Y along which the ink jet printing process is performed is perpendicular to the direction of the long axis.

Figure 4:
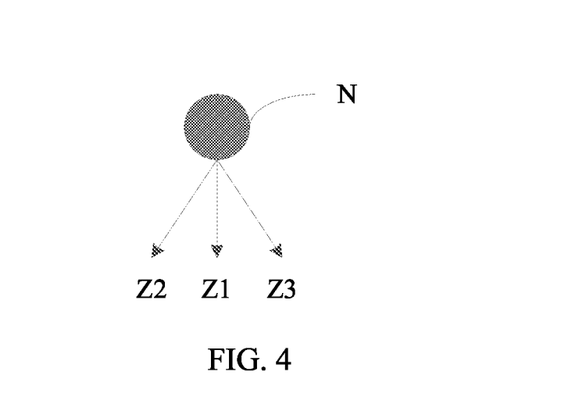
FIG. 4 is a schematic diagram of a scenario where an abnormal drop placement occurs to a nozzle during a process for preparing the display panel according to an embodiment according to the present invention.

Further, please refer to a schematic diagram of a scenario where an abnormal drop placement occurs to a nozzle N during a process for preparing the display panel 100 according to an embodiment according to the present invention shown in FIG. 4.

It should be noted that in the ink jet printing process, ink sprayed by the nozzle N does not always drop according to a preset trajectory Z1, but has a certain drop placement error. As shown in FIG. 4, when the abnormal drop placement occurs to the nozzle N, the ink sprayed by the nozzle N will drop according to a first deviation trajectory Z2 or a second deviation trajectory Z3. Therefore, in order to reduce an influence of the above-mentioned abnormal drop placement on the ink jet printing process, the printing direction (i.e., the second direction Y) for the ink jet printing is always perpendicular to the long axis of the sub-pixels. Correspondingly, a plurality of the nozzles N arranged in the first direction X will not have a relatively large density, thereby reducing a mutual influence of the nozzles N corresponding to adjacent sub-pixels during spraying.

Further, in order to prevent that many of the sub-pixels are affected when the above-mentioned abnormal drop placement occurs, the number of the sub-pixels that are arranged in the first direction X and connected to each other should not be too large. Specifically, the above-mentioned first number is preferably any integer between 3 to 5.

Further, please continue to refer to FIG. 1. The functional layers 1111 of the multiple sub-pixels with the same color of the plurality of sub-pixels in each of the pixel unit groups 110 are connected to each other through a bridge structure 112. The sub-pixels have a first width D1 in the second direction Y. The bridge structure 112 has a second width D2 in the second direction Y. The first width D1 is greater than the second width D2.

It should be noted that, in the embodiment of the present invention, setting the first width D1 to be greater than the second width D2 is for reducing a loss of ink during the ink jet printing process on one hand, and reducing an influence of functional layer ink injected into the bridge structure 112 that belongs to a non-light-emitting area on display of the display panel 100 on another hand.

Figure 7:
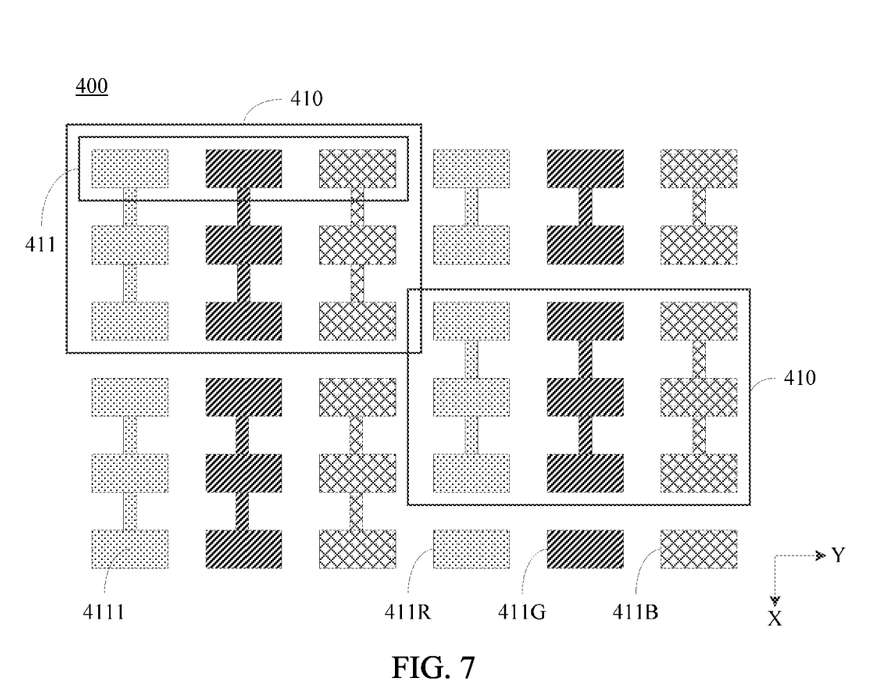
FIG. 7 is another top view schematic structural diagram of the display panel provided by an embodiment according to the present invention.

Further, please refer to another top view schematic diagram of the display panel 400 provided by an embodiment according to the present invention shown in FIG. 7.

As shown in FIG. 7, in this embodiment, functional layers 4111 of a plurality of red sub-pixels 411R that belong to different pixel units 411 in each pixel unit group 410 are arranged in a direction of the short axis of the sub-pixels and connected with each other, functional layers 4111 of a plurality of green sub-pixels 411G that belong to different pixel units 411 in each pixel unit group 410 are arranged in the direction of the short axis of the sub-pixels and connected with each other, and functional layers 4111 of a plurality of blue sub-pixels 411B that belong to different pixel units 411 in each pixel unit group 410 are arranged in the direction of the short axis of the sub-pixels and connected with each other. A direction along which the ink jet printing process is performed is perpendicular to the direction of the short axis of the sub-pixels. That is, in this embodiment, the first direction X is parallel to the short axis, and the second direction Y is parallel to the long axis.

It should be noted that, since there are multiple sub-pixels with the same color connected to each other in the first direction X, that is, during the ink jet printing process, one nozzle corresponds to multiple sub-pixels. As a result, the nozzles arranged in the first direction X will not have a larger density, which may reduce a mutual influence of the nozzles corresponding to adjacent sub-pixels during spraying to a certain degree.

Further, in the embodiment shown in FIG. 7, a plurality of the pixel unit groups 410 may also be arranged in a staggered manner in the second direction Y. Further, the arrangement in the staggered manner refers to that adjacent pixel unit groups 410 are not arranged in a straight line in the second direction Y, so that a plurality of the pixel units 411 in one of the pixel unit groups 410 correspond to parts of the pixel units 411 in other two of the pixel unit groups 410 in a one-to-one correspondence in the second direction Y.

It should be noted that, if such an arrangement is not adopted, multiple pairs of adjacent sub-pixels with the same thickness difference will be arranged along the printing direction (i.e., the second direction Y). That is, the above-mentioned thickness difference will extend along a straight line parallel to the second direction Y and will be observed by a user, and a visual effect is relatively obvious. However, if such an arrangement is adopted, the multiple pairs of adjacent sub-pixels with the same thickness difference can be arranged in a staggered manner in the printing direction (i.e., the second direction Y). Specifically, the above-mentioned multiple pairs of adjacent sub-pixels can be dispersedly arranged in the first direction X perpendicular to the second direction Y. That is, the above thickness difference will be dispersed in the first direction X, and the visual effect is less obvious, thus further reducing visual conspicuousness of the above-mentioned lateral Mura.

Specifically, in the embodiment shown in FIG. 7, the first number of the plurality of pixel units 411 arranged in the first direction X in each of the pixel unit groups 410 is 3, and adjacent two of the pixel unit groups 410 in the second direction Y are staggered from each other by 2 pixel units 411.

Further, in another modified embodiment according to the present invention, the above-mentioned first number and second number may also be other numerical values.

Figure 2:
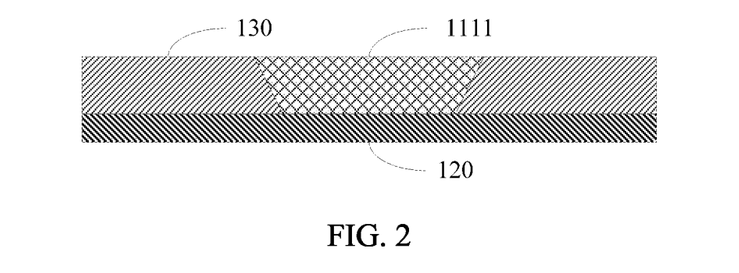
FIG. 2 is a cross-sectional schematic structural diagram of a blue sub-pixel provided by an embodiment according to the present invention.
Figure 3:
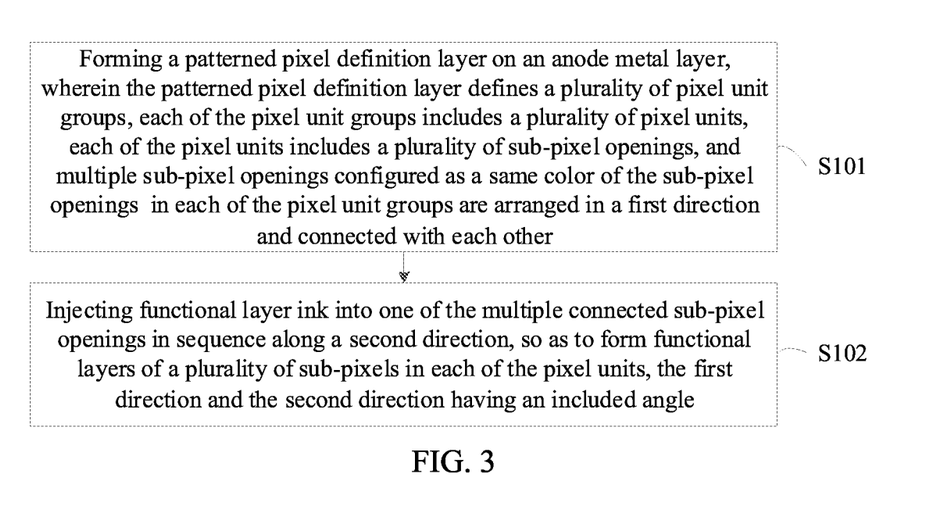
FIG. 3 is a schematic flowchart of a preparation method for the display panel provided by an embodiment according to the present invention.

Next, please refer to FIG. 2 and FIG. 3. FIG. 2 shows a cross-sectional schematic structural diagram of a blue sub-pixel 111B provided by an embodiment according to the present invention. FIG. 3 shows a schematic flowchart of a preparation method for the display panel 100 provided by an embodiment according to the present invention. As shown in FIG. 1 to FIG. 3, the preparation method may include the following steps:

a patterned pixel definition layer forming step S101: forming a patterned pixel definition layer 130 on an anode metal layer 120, wherein the patterned pixel definition layer 130 defines a plurality of pixel unit groups 110, each of the pixel unit groups 110 includes a plurality of pixel units 111, each of the pixel units 111 includes a plurality of sub-pixel openings, and multiple sub-pixel openings configured as a same color of the sub-pixel openings in each of the pixel unit groups 110 are arranged in a first direction X and connected with each other; and a functional layer forming step S102: injecting functional layer ink into one of the multiple connected sub-pixel openings in sequence along a second direction Y, so as to form functional layers 1111 of a plurality of sub-pixels in each of the pixel units 111; an included angle is formed between the first direction X and the second direction Y.

According to the foregoing, the present invention provides a display panel. The display panel at least include a plurality of pixel unit groups, each of the pixel unit groups includes a plurality of pixel units, each of the pixel units includes a plurality of sub-pixels, and each of the sub-pixels has a functional layer. For the display panel provided by the present invention, the functional layers of multiple sub-pixels with a same color of the plurality of sub-pixels in each of the pixel unit groups are arranged in a first direction and connected with each other, which reduces precision requirements for ink output of each nozzle during an ink jet printing process and reduces a thickness difference of the functional layers of each column of the sub-pixels arranged in a printing direction, thereby effectively preventing generation of lateral Mura during display of the display panel.

Figure 8:
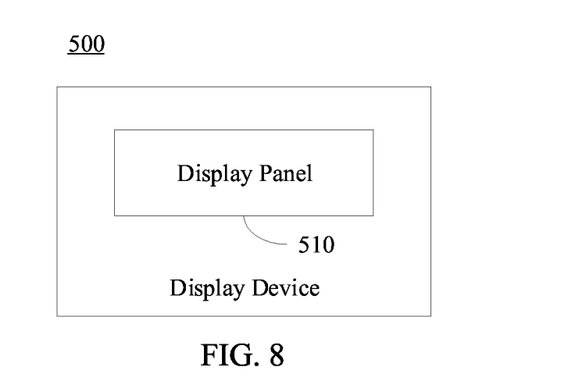
FIG. 8 is a schematic structural diagram of the display device provided by an embodiment according to the present invention.

Please refer to FIG. 8. FIG. 8 shows a schematic structural diagram of a display device 500 provided by an embodiment according to the present invention. Various components of the embodiment according to the present invention and a relative positional relationship among the various components can be seen intuitively from the figure.

As shown in FIG. 8, the display device 500 includes a display panel 510. The display panel 510 may be the display panel 100 as described in the first embodiment above, the display panel 200 as described in the second embodiment above, the display panel 300 as described in the third embodiment above, or the display panel 400 as described in the first fourth embodiment above.

In addition to the above-described embodiments, the present invention may also have other embodiments. All technical solutions formed by identical replacement or equivalent replacement fall within the protection scope of the present invention.

To sum up, although the preferred embodiments of the present invention have been disclosed as above, the above preferred embodiments are not intended to limit the present invention. Those of ordinary skill in the art can make various modifications and changes. Therefore, the protection scope of the invention is subject to the scope defined by the claims.

What is claimed is:

1. A display panel, wherein the display panel comprises:
a plurality of pixel unit groups, each of the pixel unit groups including a plurality of pixel units, each of the pixel units including a plurality of sub-pixels, and each of the sub-pixels having a functional layer,
wherein multiple pixel unit groups of the plurality of pixel unit groups are arranged in parallel in a first direction, and multiple pixel unit groups of the plurality of pixel unit groups are arranged in a staggered manner in a second direction, and an included angle is formed between the first direction and the second direction; and wherein functional layers of multiple sub-pixels with a same color of the plurality of sub-pixels in each of the pixel unit groups are arranged in the first direction and connected with each other through a bridge structure, each of the sub-pixels has a first width in the second direction, the bridge structure has a second width in the second direction, and the first width is greater than the second width.

2. The display panel as claimed in claim 1, wherein the plurality of pixel units arranged in the first direction in each of the pixel unit groups amounts to a first number, and adjacent two of the pixel unit groups in the second direction are staggered from each other by a second number of the pixel units, and the first number is greater than the second number.

3. The display panel as claimed in claim 2, wherein the first number is any value between 3 and 5, and the second number is any value between 1 and 4.

4. The display panel as claimed in claim 1, wherein the sub-pixels have a long axis and a short axis perpendicular to each other, the first direction is parallel to the long axis, and the second direction is parallel to the short axis.

5. The display panel as claimed in claim 1, wherein the sub-pixels have a long axis and a short axis perpendicular to each other, the first direction is parallel to the short axis, and the second direction is parallel to the long axis.

6. The display panel as claimed in claim 1, wherein a number of the plurality of pixel units in each of the pixel unit groups is same.

7. A preparation method for a display panel, wherein the preparation method comprises:
   forming a patterned pixel definition layer on an anode metal layer, wherein the patterned pixel definition layer defines a plurality of pixel unit groups, each of the pixel unit groups includes a plurality of pixel units, each of the pixel units includes a plurality of sub-pixel openings, and multiple sub-pixel openings configured as a same color of the sub-pixel openings in each of the pixel unit groups are arranged in a first direction and connected with each other; and
   injecting functional layer ink into one of the multiple connected sub-pixel openings in sequence along a second direction, so as to form functional layers of a plurality of sub-pixels in each of the pixel units; an included angle is formed between the first direction and the second direction, wherein multiple pixel unit groups of the plurality of pixel unit groups are arranged in parallel in the first direction, and multiple pixel unit groups of the plurality of pixel unit groups are arranged in a staggered manner in the second direction; and wherein functional layers of multiple sub-pixels with a same color of the plurality of sub-pixels in each of the pixel unit groups are arranged in the first direction and connected with each other through a bridge structure, each of the sub-pixels has a first width in the second direction, the bridge structure has a second width in the second direction, and the first width is greater than the second width.

8. The preparation method as claimed in claim 7, wherein the sub-pixels have a long axis and a short axis perpendicular to each other, the first direction is parallel to the long axis, and the second direction is parallel to the short axis.

9. The preparation method as claimed in claim 7, wherein the plurality of pixel units arranged in the first direction in each of the pixel unit groups amounts to a first number, and adjacent two of the pixel unit groups in the second direction are staggered from each other by a second number of the pixel units, and the first number is greater than the second number.

10. The preparation method as claimed in claim 9, wherein the first number is any value between 3 and 5, and the second number is any value between 1 and 4.

11. The preparation method as claimed in claim 7, wherein the sub-pixels have a long axis and a short axis perpendicular to each other, the first direction is parallel to the short axis, and the second direction is parallel to the long axis.

12. The preparation method as claimed in claim 7, wherein a number of the plurality of pixel units in each of the pixel unit groups is same.

* * * * *